United States Patent [19]
Katz et al.

[11] Patent Number: 5,221,908
[45] Date of Patent: Jun. 22, 1993

[54] WIDEBAND INTEGRATED DISTORTION EQUALIZER

[75] Inventors: Allen Katz, West Windsor; George P. Pallas, Florence, both of N.J.

[73] Assignee: General Electric Co., East Windsor, N.J.

[21] Appl. No.: 799,792

[22] Filed: Nov. 29, 1991

[51] Int. Cl.$^5$ .............................. H03F 1/26; H03F 3/16
[52] U.S. Cl. ..................................... 330/149; 330/277; 330/307
[58] Field of Search .................... 330/53, 57, 149, 277, 330/286, 296, 300, 307; 357/41

[56] References Cited

U.S. PATENT DOCUMENTS

| | | |
|---|---|---|
| 4,525,678 | 6/1985 | Lehmann et al. ............... 330/286 X |
| 4,658,220 | 4/1987 | Heston et al. .................. 330/307 X |
| 5,038,113 | 8/1991 | Katz et al. ...................... 330/277 |

Primary Examiner—Steven Mottola
Attorney, Agent, or Firm—William H. Meise; Stephen A. Young; Clement A. Berard

[57] ABSTRACT

For use in a spacecraft for correcting amplifier distortion, a wideband distortion corrector avoids the need for directional couplers. The corrector includes a FET mounted in a miniature microwave-type housing. Signal flows through the source-to-drain channel. A gate impedance selected to be inductive at the operating frequency is coupled from the FET gate to the platform of the package, and may be simply a loop of bond wire. The channel connects by a strip transmission line to an amplifier, the distortion of which is to be corrected. For enhanced bandwidth, an inductor is coupled between the FET source and drain electrodes within the miniature housing. The platform of the package is coupled to the reference conductor of the transmission line. In one embodiment, direct bias voltage is applied by way of a bias tee across a strip transmission line and ground, and galvanic connections cause the bias to appear between the FET gate electrode and the channel.

12 Claims, 10 Drawing Sheets

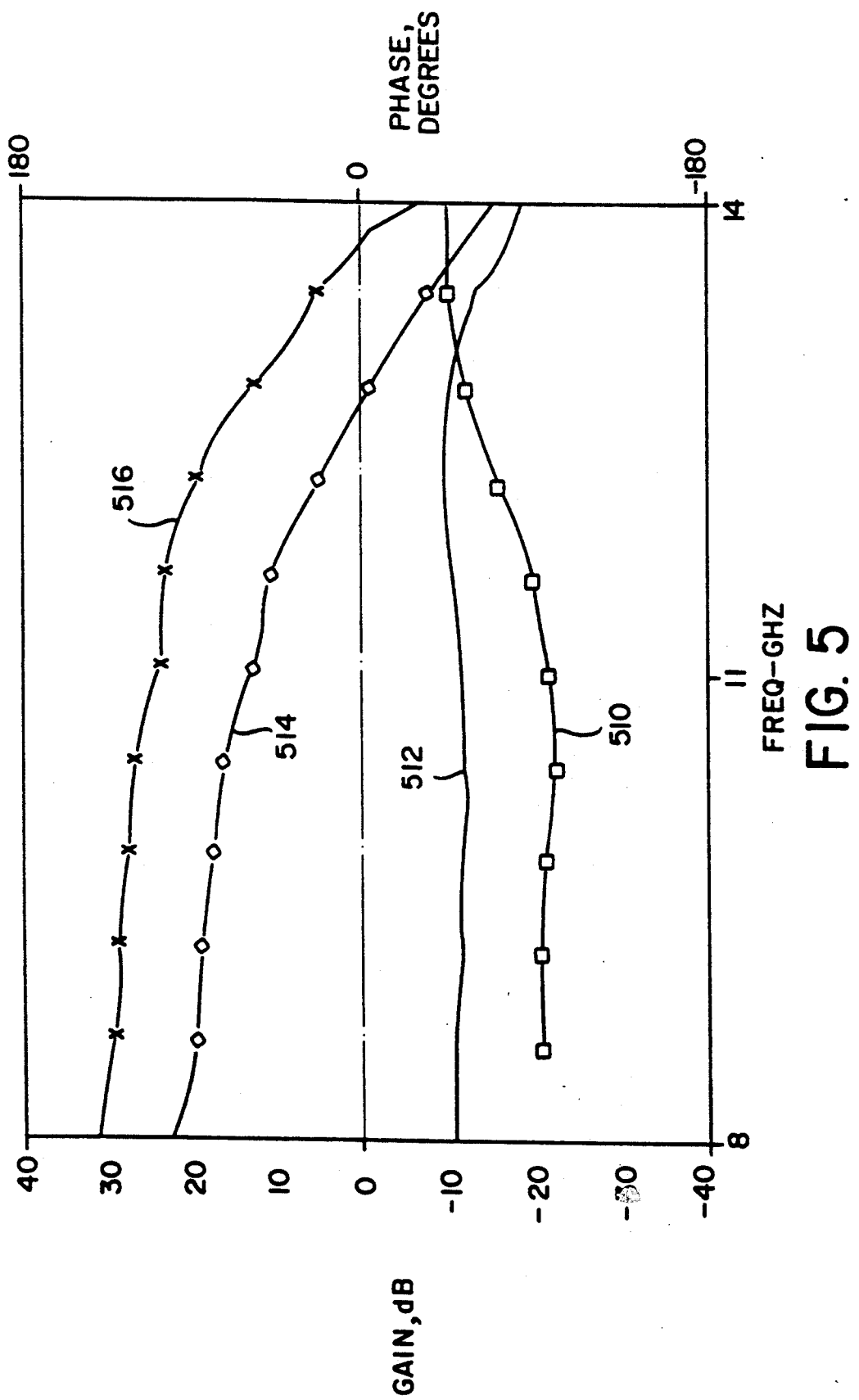

WIDEBAND INTEGRATED DISTORTION EQUALIZER

BACKGROUND OF THE INVENTION

This invention relates to distortion linearizers, and more particularly to integrated FET distortion phase and/or gain linearizers.

Satellite communications systems are finding increasing use for intercontinental and intra-continental data and entertainment information transfers. The basics of such systems are by now common knowledge, and include earth stations for transmitting information to, and for receiving repeated or translated information from, a satellite, which is often geosynchronous. The high capital costs of communications satellites requires that the greatest possible use be made of their facilities, to lower the per-unit cost of communications. The severe operating environment in space, coupled with the inability to access the orbiting satellite to effect repairs, places stringent requirements on the systems and components of a satellite and its communication system payload. A plurality of communications channels are ordinarily provided, with enhanced channel-to-channel isolation by use of combined frequency and polarization diversity, as described in U.S. patent application Ser. No. 07/772,207, filed Oct. 7, 1991 in the name of Wolkstein. The information signal at the satellite must be amplified before retransmission back to earth for reception by an earth station. In principle, the information signals received at the satellite could be amplified by a single power amplifier. However, because of the linearity limitations of amplifiers which are available at the current state of the art for operation at the desired signal amplitude or power output levels, excessive intermodulation distortion occurs when multiple channels are processed in a single amplifier.

In order to maximize the life of the satellite, the weight of every additional component must be assessed against the reduction in the useful lifetime of the satellite as a result of the reduced payload of expendable propellant (fuel or fuel-plus-oxidizer) which the component displaces. Thus, the tradeoffs of communications system performance versus weight are carefully evaluated. This evaluation is rendered more complex because of other factors which must be considered, such as power consumption, reliability and payload performance.

As described by the aforementioned Wolkstein application, conventional communications systems use individual power amplifiers in each channel to reduce intermodulation distortion. However, some forms of distortion, such as phase distortion dependent upon instantaneous signal amplitude, and signal compression with increasing signal level, are not ameliorated by the single-channel amplifying technique. In order to maximize the output power from the power amplifier in each channel, the signal level is increased to a level at which significant distortion occurs, and a distortion corrector (often termed a pre- or post-equalizer) is added in the amplifier signal path.

Many different types of equipments termed balancers, compensators and equalizers are used in systems generally and in communications systems in particular. Thus, "balancers" may be weights used on rotating devices which reduce physical vibration, or may include a potentiometer connected to the electrodes of the tubes of a push-pull vacuum-tube amplifier to reduce harmonic distortion by making the tube's operating transfer functions as similar as possible. A "compensator" may be gas diverters affixed to the barrel of a small arm or cannon to reduce recoil, a magnet attached to compass, or it may be an electrical device, of which one example is a linear (nominally independent of amplitude) variable amplitude-versus-frequency (slope) device for maintaining constant gain in transmission-line systems such as cable television systems (CATV) in the face of different coaxial cable lengths or, when thermally controlled, in the face of performance variations caused by daily and seasonal temperature variations. Similarly, an "equalizer" may be a mechanical apparatus for distributing a load across several supports or an electric conductor joining various equipotential locations in a circuit. Also, "equalizer" is another term for a variable or thermal cable compensator, as described above. A bridged tee slope equalizer including complex reactive bridge networks is described in U.S. Pat. No. 4,967,169, issued Oct. 30, 1990 to Sun et al. A distortion equalizer corrects, in some way, for the distortion of an associated non-linear circuit. A "predistortion" equalizer is a nonlinear apparatus, inserted in the signal path between a signal source and a non-linear apparatus such as a signal amplifier, for predistorting the signal in response to amplitude so that the amplitude and/or phase distortion introduced by the following non-linear stage is wholly or partially cancelled. A post-distortion equalizer performs the same function at the output of the non-linear stage. Since the non-linear device for which compensation is required is usually a power amplifier, a post-distortion equalizer must handle higher signal amplitudes that a predistortion equalizer, for which reason predistortion equalizers are preferred.

As mentioned, satellite system tradeoffs are carefully evaluated in terms of power consumption, reliability, weight and performance. A great deal of attention has been directed to the tradeoffs between solid-state amplifiers and travelling-wave tubes as channel amplifiers for satellite communications, and at this time both are being improved and both types are currently used for frequency ranges from about 2 Gigahertz (GHz) to 13 GHz. Distortion equalizers include transmission schemes such as the dual-gate, common-source FET scheme described in U.S. Pat. No. 4,465,980, issued Aug. 14, 1984 to Huang et al, in which the signal is applied to one gate, and detected signal from a signal sample is applied to the other gate to generate the desired distortion. The signal sample is produced by a directional coupler. Directional couplers appear in other predistortion circuits, such as U.S. Pat. No. 4,109,212, issued Aug. 22, 1971 in the name of Donnell et al; U.S. Pat. No. 4,283,684, issued Aug. 11, 1981 in the name of Satoh; U.S. Pat. No. 4,564,816, issued Jan. 14, 1986 in the name of Kumar et al; and U.S. Pat. No. 4,588,958, issued May 13, 1986, in the name of Katz et al. These prior distortion equalizers have a salient disadvantage for satellite use, in that they use directional couplers. Such directional couplers are often designed as waveguide branch devices, which are assemblages of two parallel "through" waveguides, with a plurality of "branch" waveguides extending therebetween, which are dimensioned to produce the desired linear power division and linear phase shift. Such waveguide devices must have dimensions which are significant portions of a wavelength at the frequency of operation, and so they cannot be miniaturized. As a result, the waveguide directional coupler for a satellite predistortion equalizer, and possibly other components of some equalizers, tend to make each distortion equalizer bulky and heavy. This is particularly disadvantageous in multi-channel systems, because each channel includes a predistortion equalizer.

Reliability of satellite systems is enhanced by redundancy schemes. In many satellite communication systems, switched routing schemes allow high-priority signals to be routed to operative channels in the event of a channel failure. Among the system portions which are more likely to fail are the amplifiers. Consequently, redundancy schemes often involve switching the amplifiers among channels, together with supernumerary, ordinarily unused amplifiers, which can be switched into a channel to replace a failed amplifier. A concomitant of such a redundancy scheme is that each amplifier, and its associated distortion equalizer, must be capable of broadband frequency performance.

U.S. Pat. No. 5,038,113, issued Aug. 6, 1991 in the name of Katz et al, describes a transmission-type equalizer comprising an FET with its source-to-drain conductive path coupled in series with a transmission line, in contrast to the above-mentioned Huang et al common-source arrangement, and with a gate-to-ground reactance and gate bias selected to produce the desired level of distortion of the signals. In general, this transmission-type FET acts as a lossy transmission element, in which the loss decreases with increasing signal, to produce signal expansion. The signal expansion with increasing signal level offsets the signal compression occasioned by the associated amplifier. The phase shift through the transmission FET is also affected by the signal level. Several "modes" of operation of the Katz et al transmission FET distortion equalizer have been identified, which depend upon the gate bias voltage and the gate impedance. Three modes, each with about 5% bandwidth, have been identified, with both increasing and decreasing phase shift as a function of increasing signal level. A fourth mode provides gain expansion at frequencies below about 3 GHz with the FETs currently available. A fifth mode of operation is relatively broadband, and provides useful gain expansion at and above Ku-band (about 12 GHz). While this fifth mode of operation provides gain expansion in a region which is of interest at certain satellite communication frequencies, it provides phase shift which decreases (less time delay) with increasing signal power level, which may not be suitable for equalizing those amplifiers which have a similar phase distortion. To equalize distortion for those amplifiers subject to signal or gain compression together with decreasing phase shift in response to increasing signal power level, the distortion equalizer must have gain expansion coupled with phase shift which increases (more time delay) with increasing power level.

A copending patent application entitled, "Balanced Reflective Nonlinear Processor using FET," Ser. No. 07/753,164, filed Aug. 30, 1991 in the name of Katz et al, describes a reflective, balanced arrangement of transmission FET distortion generator operated in a reflective mode, which provides gain expansion together with increasing phase shift, as a function of increasing signal power level. This arrangement uses a coupler as part of the reflective balanced arrangements.

An improved distortion generator is desired.

SUMMARY OF THE INVENTION

A semiconductor-integrated-circuit carrier or package includes a planar platform which is electrically conductive, and which may be made from metal, and also includes first and second terminals adjacent to, and electrically isolated from said platform and from each other. A semiconductor substrate is mounted on the platform. A FET including source, drain and gate electrodes is formed on the upper surface of the substrate. The substrate material has a sufficiently low electrical conductivity so that the elements of the FET are isolated from the platform. The gate electrode of the FET is coupled to the platform, and the source and drain electrodes are each coupled to one of the first and second terminals. A distortion generator using the FET takes advantage of the controllable signal path extending between the source and drain electrodes. The controllable path is coupled in a signal transmission path. In one embodiment of the invention, the gate electrode is coupled to the platform by a selected impedance, and the platform is connected to reference. The FET is biased to provide the desired distortion of the signal traversing the controllable path. For use in conjunction with signal processors exhibiting gain compression together with decreasing phase shift in response to increases in signal level, an inductance is coupled across the controlled signal path of the FET. The inductance provides a linear shunt path by which signal tends to bypass the FET path, principally when the FET path is in a high-impedance state, so the signal flows principally through the inductance. When the FET path has a low impedance, the effect of the inductance is reduced. In a particular embodiment of the invention adapted for use in the 11 to 13 GHz range, the inductance is provided by a discrete air-core solenoidal coil. In another embodiment of the invention, adjustment of phase control substantially independent of gain expansion control is provided by a resistance serially coupled with the inductance to form a series combination coupled between the source and drain electrodes of the FET. At a particular value of the resistance, the phase change in response to signal power level is approximately zero, and the FET distortion generator provides only gain expansion with increasing signal level.

DESCRIPTION OF THE DRAWING

FIG. 5 plots computer-generated amplitude and phase responses of the FET distortion generator of FIG. 4 as a function of signal amplitude over a frequency range of 8 to 14 GHz;

FIGS. 8b and 8c are plots of measured phase and amplitude response, respectively, of a cascade of a traveling-wave tube amplifier with a predistortion equalizer, similar to that of FIG. 8a;

FIG. 9 is a plot of Carrier-to-Intermodulation (C/I) ratio versus backoff for the linearized TWTA of FIG. 8a;

DESCRIPTION OF THE INVENTION

Figure 1:
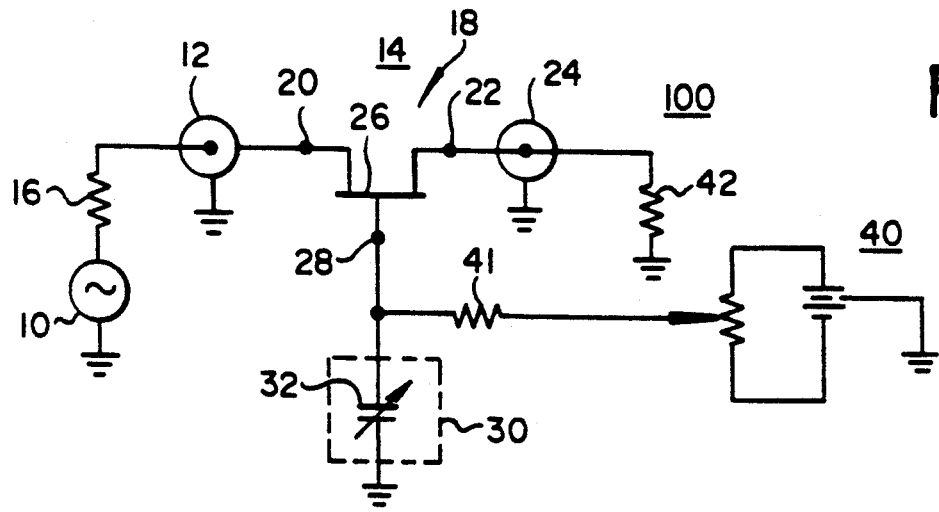
FIG. 1 illustrates the basic prior art FET distortion generator.

FIG. 1 is a schematic diagram of a prior art distortion generator as described in the above-mentioned Katz et al U.S. Pat. No. 5,038,113. In FIG. 1, a source 10 of alternating signal is coupled by a transmission line, illustrated by a coaxial transmission line symbol 12, to a distortion generator designated generally as 14. The impedance presented to the distortion generator is illustrated as a resistor 16, and depends, as known, upon the internal impedance of source 10 and upon the length, attenuation and characteristic impedance of transmission line 12. Distortion generator 14 includes a FET 18 having a source electrode 20 connected to transmission line 12, and a drain electrode 22 connected to an output transmission line represented by a coaxial transmission line symbol 24. A utilization device or load is represented by a resistor 42. A source-to-drain conductive path 26 extends between source electrode 20 and drain electrode 26, and its conduction is modulated or controlled by the voltage applied between a gate electrode 28 and conductive path 26. An impedance illustrated as a dashed block 30 is coupled between gate 28 and ground (or other reference potential, if desired). As illustrated within block 30, the reactance may be provided by a capacitor 32. However, as described in the aforementioned Katz et al patent, the net reactance between gate and ground is inductive because of path length considerations. A bias voltage source designated generally as 40 is coupled by an isolation or decoupling impedance or device represented as a resistor 41 to gate electrode 28, for biasing the FET to a region of desired nonlinearity. Those skilled in the art know that a resistor having a value of about 500 ohms or more may be suitable for decoupling in the circuit of FIG. 1 and also for providing current limiting, and that series radio frequency chokes (RFCs) may be used instead, and that shunt capacitors may be used on the side remote from the RF to aid in decoupling. Bias voltage source 40 applies voltage between gate electrode 28 and controllable path 26 by a path which includes isolation resistor 41 and either (or both) source impedance 16 and load impedance 42, and the ground connection.

Figure 2:
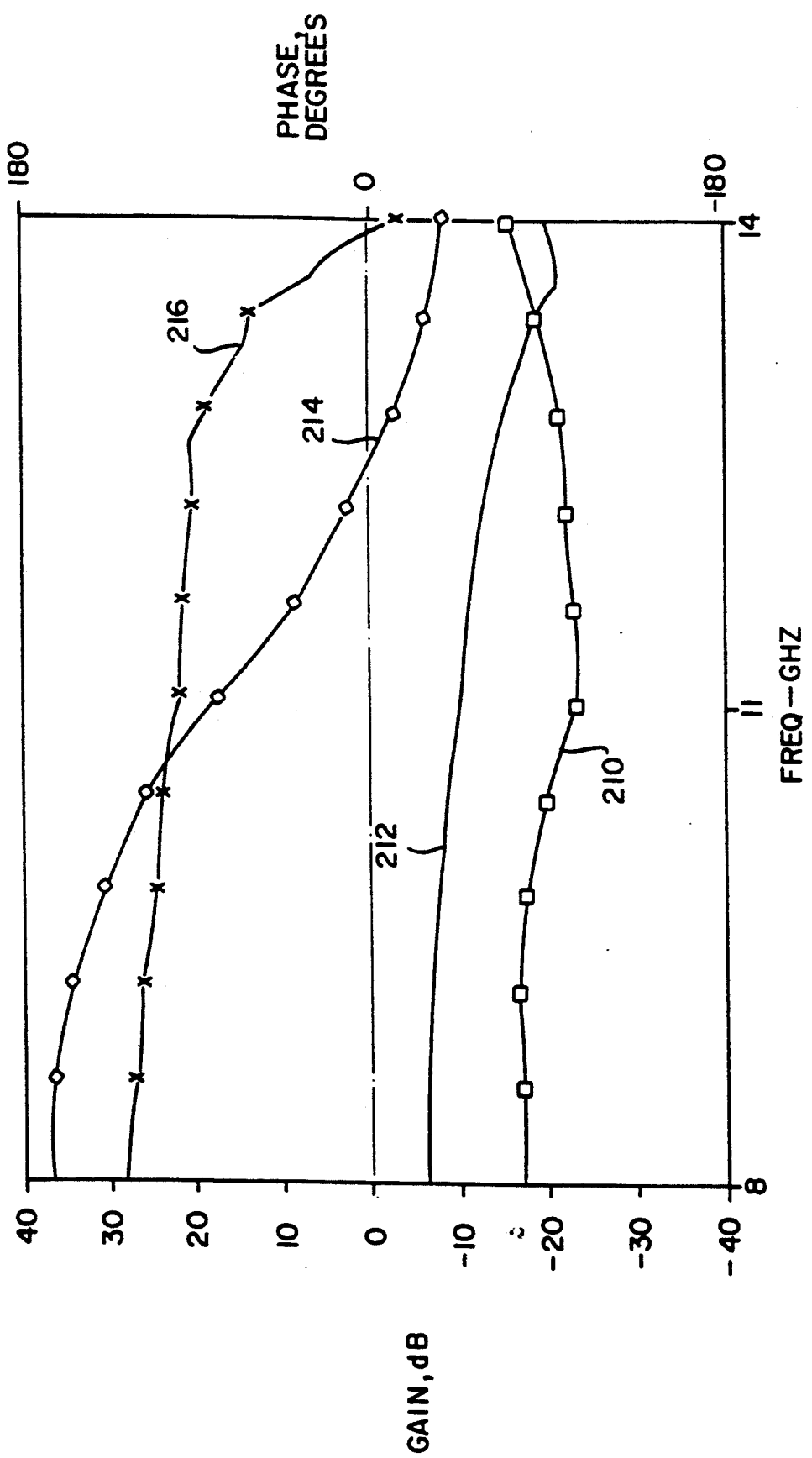
FIG. 2 plots computer-generated amplitude and phase responses as a function of frequency of the FET distortion generator of FIG. 1 in a particular operating mode, illustrating, as a function of increasing signal level, relative phase delay in one frequency range, and phase advance in another frequency range.

FIG. 2 plots modeled or calculated amplitude and phase response of FET distortion generator as a function of frequency, with signal input amplitude or level as a parameter, for the structure of FIG. 1 using a NEC type N673 FET. In FIG. 2, plot 210 represents the amplitude response or gain of the structure of FIG. 1 with 0.1 nanohenries (Nh) of inductance from gate to ground, at an input signal level of −25 dBm, and plot 212 represents the calculated gain response at the higher input signal level of 0 dBm. Plots 210 and 212 show negative gain, also known as loss. As illustrated, plots 210 and 212 converge at about 13 GHz. Below about 13 GHz, the amplitude response is about 5 to 15 dB greater at high signal levels than at low signal levels, thereby indicating a gain expansion by a like amount as a function of, or "with", increasing signal level. The response illustrated by plots 210 and 212 would provide gain expansion useful for correcting an amplifier's gain compression at frequencies from 8 GHz (and possibly below) up to about 13 GHz.

The calculated phase response of the structure of FIG. 1 at low input signal levels is illustrated by plot 214 in FIG. 2, and at high signal input levels by plot 216. As illustrated by plots 214 and 216 in the frequency range of about 11 to 14 GHz, a phase advance (change in the positive-phase direction) occurs as the signal level increases from low to high levels while a phase lag occurs from 8 to about 11 GHz. Clearly, such a response cannot correct over the complete frequency range 8 to 14 GHz for an amplifier phase response which either advances (becomes more positive) or retards (becomes more negative) with increasing signal level. In particular, it cannot correct over the entire frequency range for an amplifier which experiences a retarding or decreasing phase shift with increasing signal level. Thus, even though the amplitude response or expansion as illustrated by plots 210 and 212 might be satisfactory over the frequency range of 8 to 13 GHz, the phase response is not suitable for distortion correction of at least some amplifiers.

Figure 3:
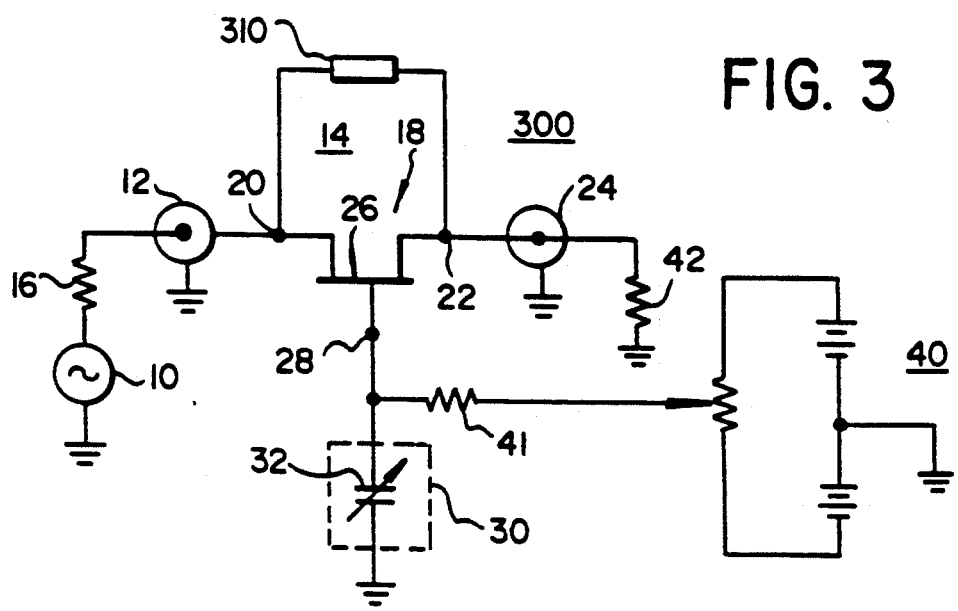
FIG. 3 is a simplified schematic diagram of a distortion generator in accordance with the invention, in which the FET source-to-drain path is bridged by an impedance.

FIG. 3 is a simplified schematic diagram of a distortion corrector, equalizer or compensator 300 in accordance with an aspect of the invention. In FIG. 3, elements corresponding to those of FIG. 1 are designated by like reference numerals. FIG. 3 differs from FIG. 1 only in that a linear impedance illustrated as a block 310 is bridged from source electrode 20 to drain electrode 22, across controlled path 26. Controlled path 26 of FET 14 is effectively coupled as a voltage divider with load 42. In the presence of bridging impedance 310, two paths exist for the flow of signal from source 10 to load 42, a first non-linear path through controlled path 26, and a second linear path by way of impedance 210. It should particularly be noted that, as FET 26 is operated essentially without source-to-drain bias, and its source and load impedances (16 and 42) are ordinarily equal, it does not act as an amplifier. Therefore, impedance 310 is not a feedback impedance, but rather might be styled a "parallel" or "feedforward" impedance.

It has been discovered that, when impedance 310 of FIG. 3 is an inductance, the phase control can be used over a broader frequency band. This may be understood by considering that the phase angle of the signal passing through the FET at high power levels, represented by plot 216 of FIG. 2, is principally capacitive (i.e. the signal passing through the FET is phase advanced). At low signal power levels, the phase angle at frequencies above 11 GHz is less capacitive, and even becomes slightly inductive (phase lag) at frequencies above about 12 GHz. At frequencies below 11 GHz the signal exiting the FET at low input power is phase advanced relative to that at high input power levels. When the FET path is bypassed by an inductive impedance 310 as in FIG. 4, at high signal power (low FET loss), the component of the signal which is contributed by the inductance is small in amplitude relative to the component passing through the FET, and makes little difference to the net phase angle, which remains advanced. At low signal power (high FET loss), the phase advanced signal contributed by the FET is reduced in amplitude, whereby the phase delayed component contributed by the inductance becomes relatively larger, and the net signal is phase retarded or delayed.

Figure 4:
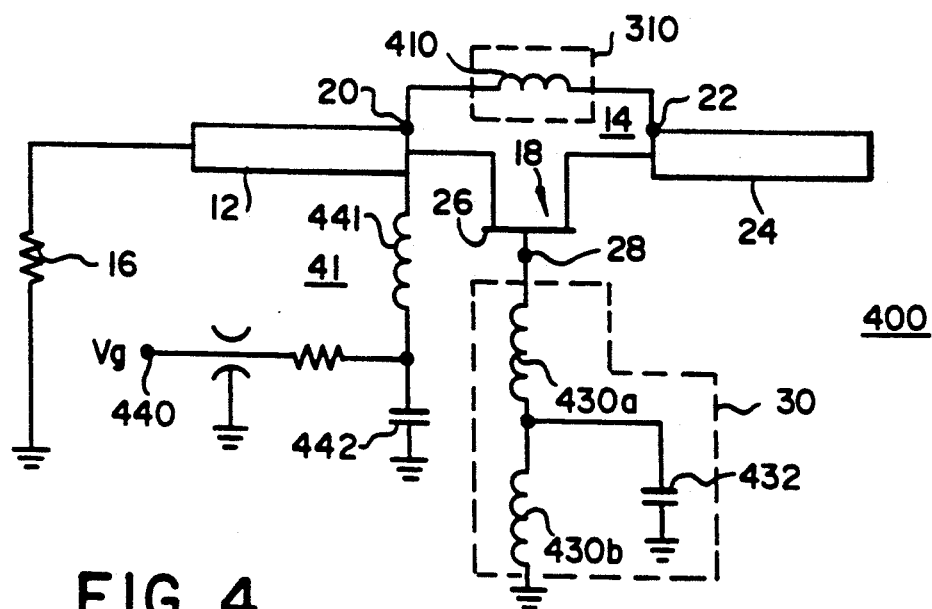
FIG. 4 is a simplified block diagram of the arrangement of FIG. 3 in which the bridging impedance is an inductor.

FIG. 4 is a simplified schematic diagram of a distortion generator 400 in accordance with an aspect of the invention. In FIG. 4, elements corresponding to those of FIGS. 1 and 3 are designated by the same reference numerals. As illustrated in FIG. 5, the input and output transmission lines are strip transmission lines of the type well known in the art and often referred to as "microstrip", which is used for microwave integrated circuits or monolithic microwave integrated circuits (MMICs). Within gate-to-ground impedance block 30 of FIG. 4, the impedance includes two series-connected inductors 430a and 430b with a juncture 432 therebetween, and a capacitor 434 connected from the juncture to ground. Bridging impedance 310 is an inductor 410 connected between source electrode 20 and drain electrode 22. The decoupling impedance, designated generally as 41, includes radio-frequency choke (RFC) 541, a shunt or decoupling capacitor 542 to ground, a resistor 544, and a feedthrough capacitor 546. The term radio-frequency refers generally to any frequency above about 50 KHz which is capable of being radiated, and in relation to the described embodiments refers to microwave and millimeter-wave. A gate source voltage Vg is applied a bias voltage terminal 540 from a source (not illustrated).

In a particular embodiment illustrating an aspect of the invention, inductors 430a and 430b of FIG. 4 are each half-loops (i.e. similar to a Greek letter Ω) of 0.0007 inch diameter (0.7 mil) conductive wire, each with wire length of 10 mils. The actual inductance of such inductors is difficult to determine because the area included within the entire circuit loop contributes to the inductance, so the inductance depends not only upon the half-loop "inductor" but also on the layout of the associated circuit. Capacitor 432 has a value of 0.1 pF, and is used principally as a tie point for inductors 530. In this same embodiment, shunt inductor 510 consists of three similar half-loops connected in parallel to thereby simulate a single larger-diameter conductor, to thereby decrease the total inductance. Each of the three half-loop conductors comprising inductor 510 have 0.7 mil diameter and a wire length of 12 mils. The FET is a Nippon Electric GaAs type NE673.

Plot 516 of FIG. 5 represents the calculated net phase response of the arrangement of FIG. 4 at the same high input power level of 0 dBm as that of plot 216 of FIG. 2. At low input signal power (−25 dBm), on the other hand, the contribution by inductive shunt or bridging impedance 310 causes a significant change in the net phase. The effect of the shunt inductance at low signal levels is to move the phase plot represented by 214 of FIG. 2 in the negative phase direction (i.e. a phase lag), resulting in a net phase shift represented as plot 514 of FIG. 5. As illustrated in FIG. 4, this change in phase between the high and low signal levels, as represented by plots 514 and 516, is relatively constant across the entire 8 to 14 GHz frequency band. The amplitude expansion in the presence of the shunt inductance, represented in FIG. 5 by low-power plot 510 and high-power plot 512, is substantially unchanged from that represented by plots 210 and 212 of FIG. 2. Thus, the inductive bridging impedance results in a broad frequency range over which more consistent phase performance is achieved, without significant effect on the gain.

Figure 6A:
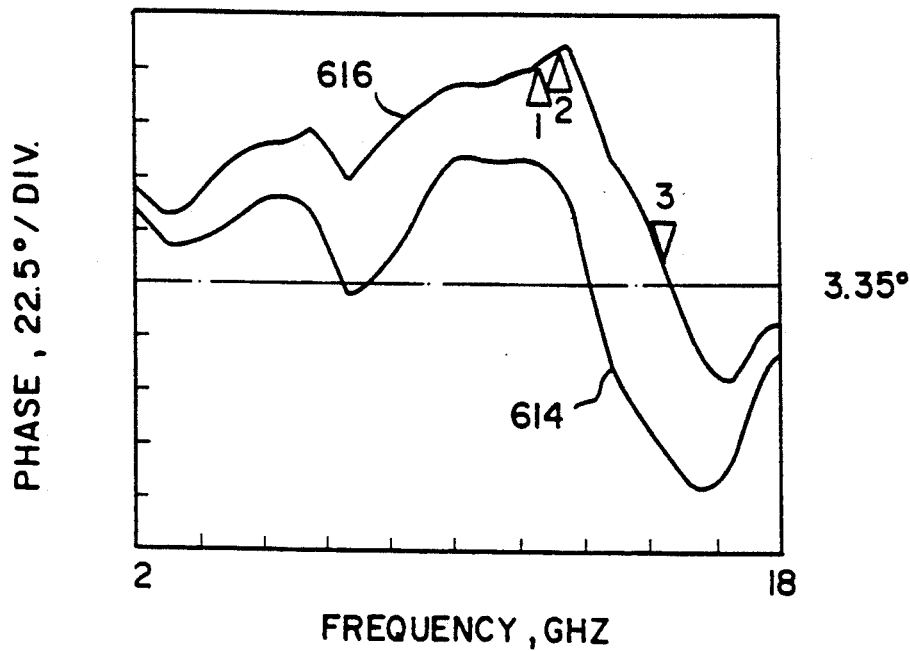
FIGS. 6a and 6b are plots of phase and amplitude responses, respectively, measured on a distortion generator as in FIG. 4, over a range of 2 to 18 GHz.
Figure 6B:
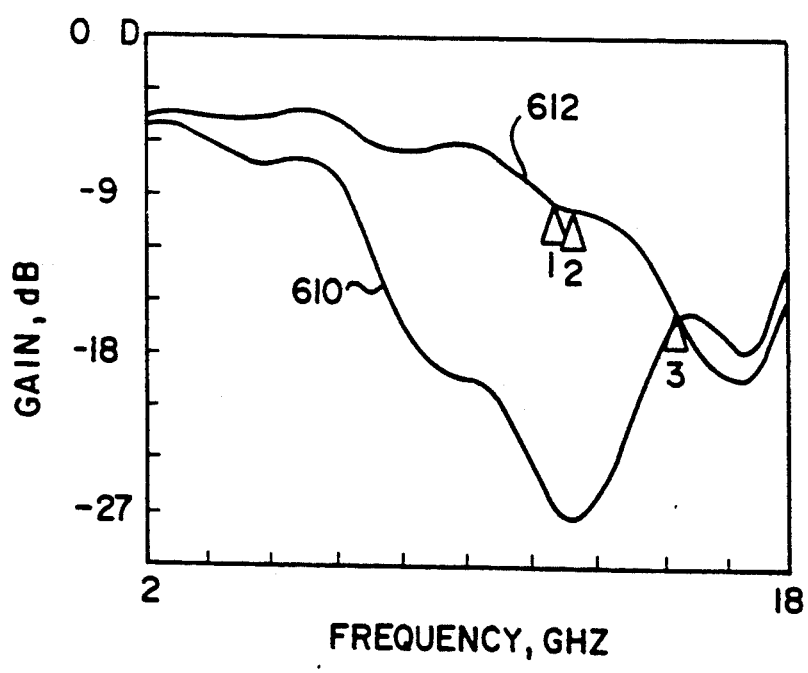

FIG. 6a plots measured phase of the distortion generator of FIG. 4 over the frequency range of 2 to 18 GHz, with signal input amplitude as a parameter. The gate bias is about −0.95 volts. Markers 1 and 2 define 11 and 13 GHz, respectively. Marker 3 is the frequency at which gain crossover occurs, as described below. In FIG. 6a, plot 614 represents the a low signal power level of −25 dBm input power, and plot 616 represents the high power level of 0 dBm. As illustrated, the difference in phase angle between the high and low power levels remains relatively constant over broad frequency ranges. FIG. 6b plots measured amplitude response of the structure of FIG. 4 over the frequency range of 2 to 18 GHz for the same low (plot 610) and high (plot 612) signal amplitudes. Gain expansion occurs over the frequency range from 2 GHz to marker 3, which is at about 15 GHz. The gain expansion in the range 2–15 GHz, together with increasing phase angle with increasing signal power level, is desirable for compensating the amplitude compression and decreasing phase angle with increasing signal power exhibited by some amplifiers including traveling-wave tube amplifiers.

Figure 7A:
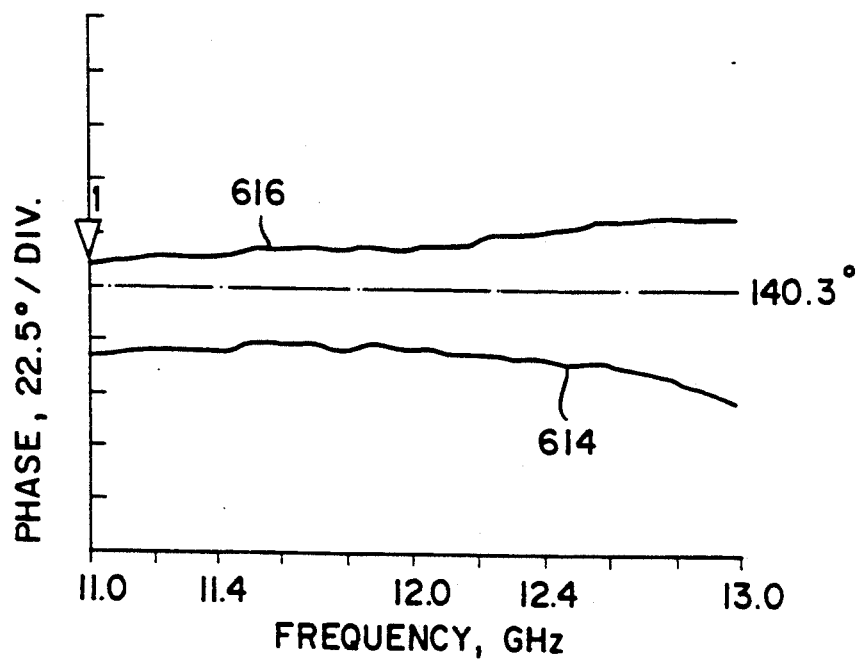
FIGS. 7a and 7b are plots corresponding to those of FIGS. 5a and 5b, respectively, measured over the frequency range 11 to 13 GHz.
Figure 7B:
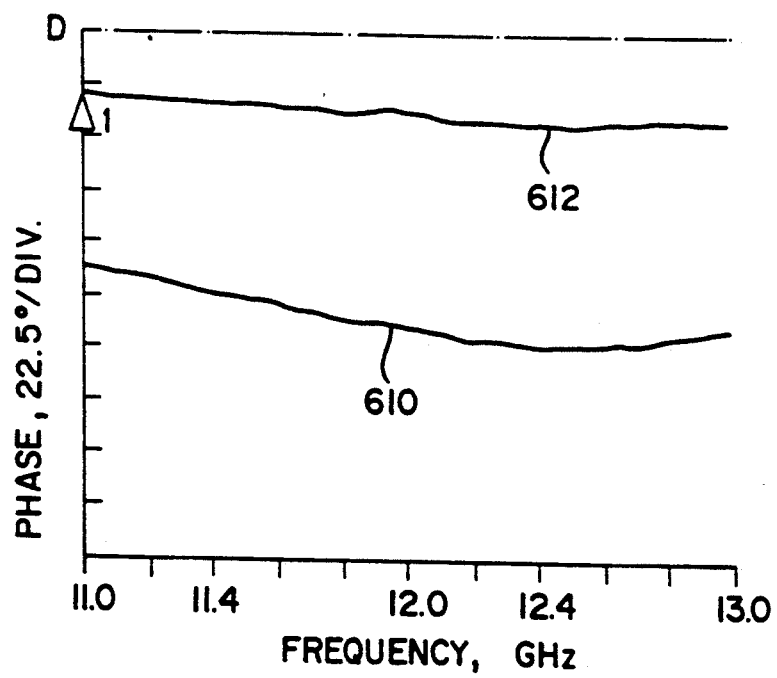

FIGS. 7a and 7b are expanded portions of plots 6a and 6b, illustrating details of the response in the frequency range of 11 to 13 GHz. Since the plots of FIGS. 7a and 7b are the same as those of FIGS. 6a and 6b, respectively, the same reference numerals are used. Also, the high power level is 0 dBm and the low power level is −25 dBm, as in FIGS. 6a and 6b. Performance such as that illustrated is useful in helping to compensate distortion over at least some frequency bands used in satellite communications. Of course, other types of FETs and other inductors may provide suitable performance over other frequency ranges.

Figure 8B:
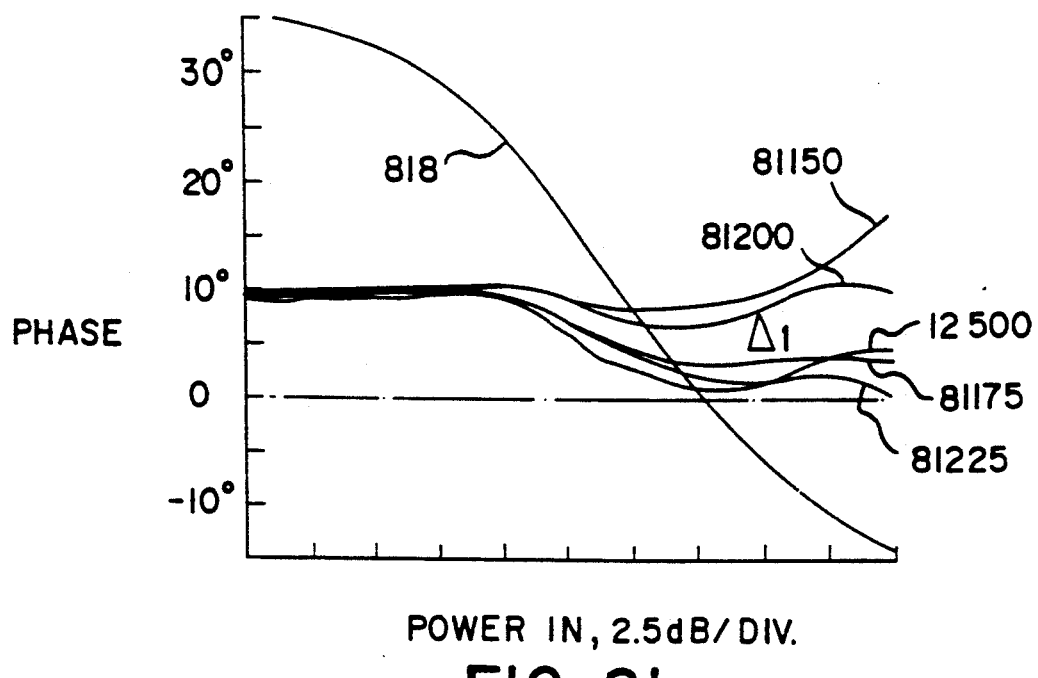
Figure 8C:
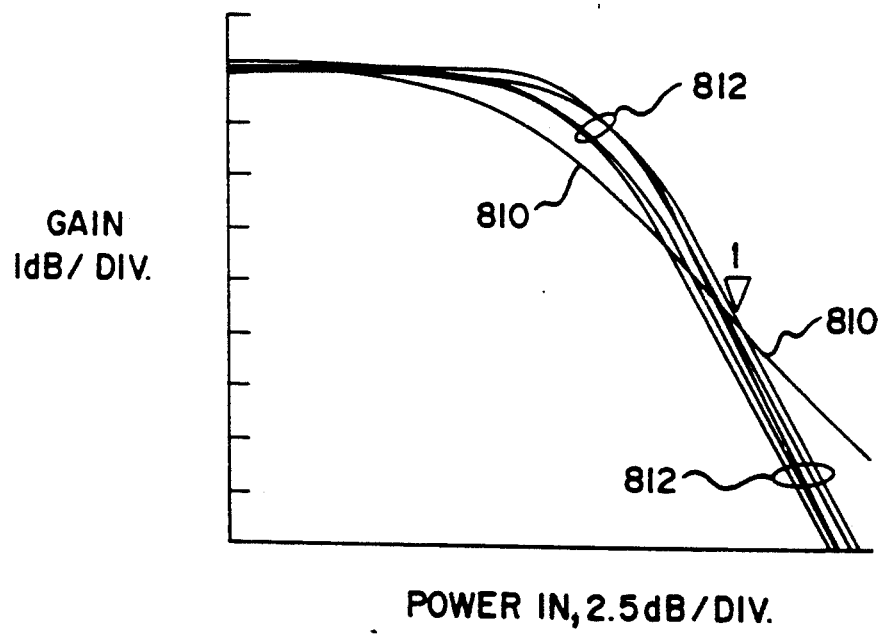
Figure 8A:
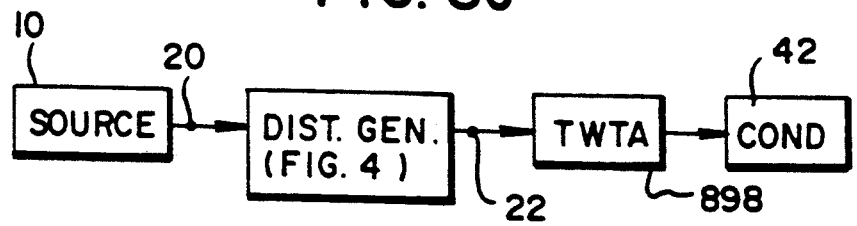
FIG. 8a is a simplified block diagram of the predistortion equalizer of FIG. 4 cascaded with a traveling wave tube amplifier.

FIG. 8a is a simplified block diagram of a TWT amplifier (TWTA) 898 cascaded with a predistortion equalizer 400 similar to that of FIG. 4, both coupled between source 10 and load 42. FIG. 8b illustrates plots of the phase response versus signal output amplitude of the arrangement of FIG. 8a with a TWTA alone, and the TWTA together with a distortion generator as in FIG. 8a. FIG. 8c illustrates the amplitude response of the TWTA alone and with the predistortion equalizer. Plot 818 of FIG. 8b represents the phase response of the TWTA alone. As illustrated, the phase of the TWTA begins at a 0° reference value at low signal amplitude, and progressively becomes and more negative with increasing input signal level, for a total phase change of about 50° over the illustrated amplitude range. Plots 81150, 81175, 81200, 81225 and 81250 represent the distortion-compensated phase versus signal input amplitude at 11.50, 11.75, 12.0, 12.25 and 12.5 GHz, respectively. As illustrated, the plots representing compensated phase are congruent and constant at a reference value of −25° at lower power levels, and no frequency plot deviates more that about 10° from the reference value during excursions from minimum to maximum power. This is a significant improvement in phase performance over the TWTA alone.

FIG. 8c illustrates a plot 810 of output signal amplitude versus input signal amplitude (compression or gain plot) for the abovementioned TWTA alone, and a group of plots, designated together as 812, represents corresponding plots at differing frequencies, with the TWTA corrected by predistortion apparatus 400 of FIG. 4. In FIG. 8C, marker 1 identifies the saturation power point of the TWT, which is the input power point which produces maximum output power, and above and below which the output power decreases. As illustrated in FIG. 8C by plot 810, the TWTA alone goes into gradual compression beginning about 15 dB below the saturation point, and reaches about 1 dB compression about eight dB below saturation. Distortion-corrected plots 812 are still almost linear at this power level, representing a gain of about seven dB of linear operating level by comparison with the TWTA alone.

Figure 9:
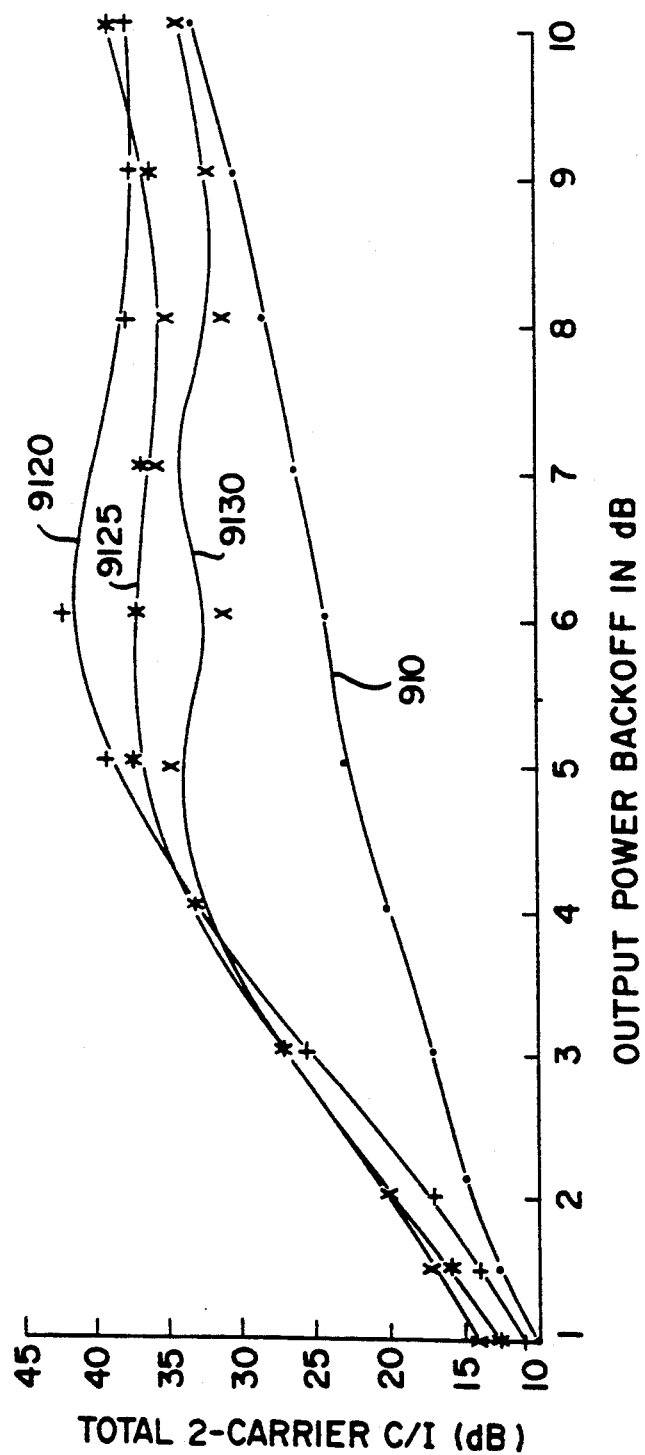

FIG. 9 plots two-carrier carrier-to-intermodulation (C/I) ratio versus signal level or power backoff from single-carrier saturation of the TWTA, with frequency as a parameter. In FIG. 9, plot 910 represents the performance of a TWTA at 12 GHz, while plots 9120, 9125, and 9130 represent the C/I ratio at 12, 12.5 and 13.0 GHz, respectively, for the TWTA cascaded with a predistortion equalizer according to FIG. 4. Higher C/I ratios represent better performance. As illustrated in FIG. 9, a power backoff of 4 dB reduces the C/I ratio of the TWTA alone by 20 dB, while the predistortion compensated TWTA has C/I ratio improvement greater than 32 dB at the same backoff. This is an improvement in C/I ratio. Several dB of C/I ratio improvement is provided by the predistortion compensator at all frequencies in the 12 to 13 GHz range, at all amounts of backoff to 10 dB.

Figure 10:
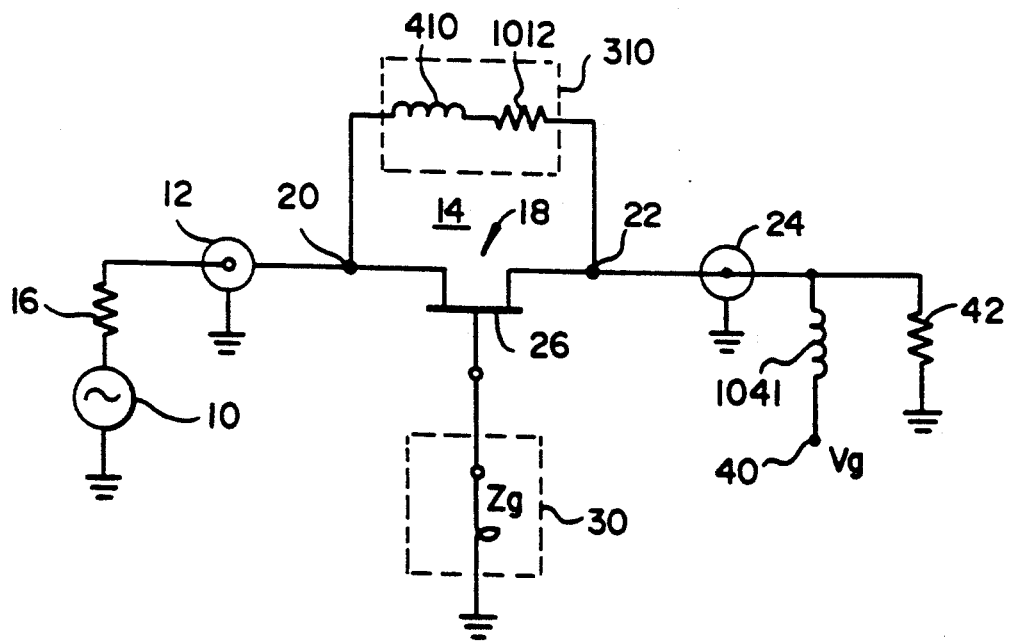
FIG. 10 is a simplified schematic diagram of a distortion generator in accordance with the invention in which a resistor is serially coupled with an inductor to form a series combination, and the series combination is bridged across the controlled current path of a FET.

It has been discovered that independent control of amplitude and phase changes can be achieved. When bridge impedance 310 of FIG. 2 includes an inductance in series with a resistance, the magnitude of the resistance can control the magnitude and direction of the change in phase shift. FIG. 10 illustrates a distortion generator similar to that of FIG. 4, in which bridge impedance 310 includes an inductor 510 in series with a resistor 1012. The impedance of gate impedance 30 is assumed to be an inductance to ground. The bias of the linearizer of FIG. 10 is provided by an impedance 1041 coupled to output transmission line 24. As modeled and calculated (not illustrated), the phase change as a function of power level reaches zero at a resistor 1012 value of about 300 ohms. This value of resistance has negligible effect on the change of gain as a function of signal level.

Those skilled in the art know that the skin depth (which means, roughly, the depth into a conductor that significant RF current flows) depends upon the conductivity of the conductor and upon the frequency of operation. The smaller the skin depth, the greater the effective resistance of the conductor. Thus, if the diameter of the wire of which inductor 410 of FIG. 10 is made small, the effective value of resistance 1012 connected in series with inductor 410 becomes larger, while a larger-diameter wire may result in a smaller resistance. Thus, a discrete resistor 1012 may not be necessary in order to obtain a value for resistor 1012, but instead more or less conductive materials, with large or smaller dimensions, may be used.

It has also been discovered that, when bridge impedance 310 of FIG. 4 is an inductance, the change in gain or compression as a function of signal level can be adjusted without significantly affecting the change in phase. When the value of bridge or shunting inductance 510 is very small, it acts essentially as a short-circuit which bypasses the nonlinear FET conducting path 26. As a consequence, for very small values of inductance, the change of gain as a function of signal level or the nonlinearity of the distortion generator as a whole becomes small. When the bridging inductance is large, a relatively large amount of the signal flows through the nonlinear FET path rather than through the linear inductor, with the result that the nonlinearity of the distortion generator as a whole tends to be large. By judicious selection of the inductance value, various amounts of nonlinearity can be established.

Figure 11C:
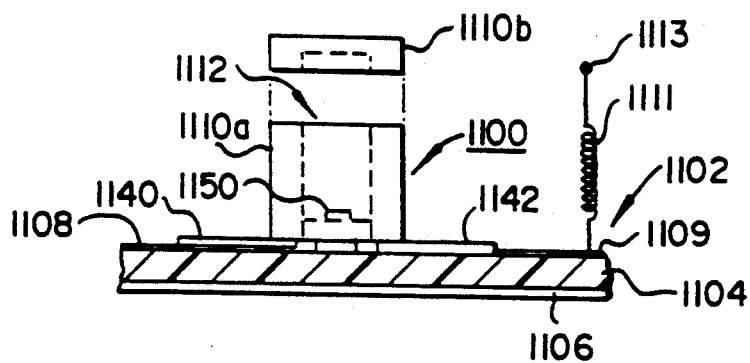
FIG. 11a is an perspective or isometric representation of an integrated-circuit package, exploded and partially cut away to illustrate interior details.
FIG. 11b is a perspective or isometric view of a FET chip in the integrated-circuit package of FIG. 11a, and FIG. 11c is an elevation view, cut away, illustrating the mounting of the package of FIG. 11a on a printed wiring board.

For a particular spacecraft application, it was desired to substitute a predistortion linearizer as described in conjunction with FIGS. 1–10 for one stage of an existing four-stage FET driver amplifier. The retrofit was simplified by placing the entire RF portion of FET linearizer within an integrated-circuit or substrate package (carrier) identical to that used as a carrier for the FETs of the driver amplifier. In the particular amplifier referred to, the FETs are mounted in KYOCERA Type 70 hermetically sealed housings. FIG. 11a is an exploded perspective or isometric representation of such an integrated-circuit package, exploded and partially cut away to illustrate interior details.

In FIG. 11, an integrated hybrid linearizer 1100 equivalent to that of a portion of FIG. 4 includes a bipartite ceramic package consisting of a carrier body 1110a and a matching lid 1110b. The illustration represents a KYOCERA type 70 integrated-circuit carrier or housing, arranged according to an aspect of the invention. Carrier 1110a & 1110b includes a cylindrical central cavity 1112 formed in body 1110a, and within which the components are carried. Lid 1110b includes a matching portion 1114 of cavity 1112 to provide additional interior volume. A bottom 1116 of cavity 1112 is flat ceramic, on the upper surface of which a platform metallization 1118 is supported. Platform metallization 1118 is relatively wide near the edges of cavity 1112 and more narrow near the center of the cavity. Additional metallizations 1120 and 1122 are also supported by ceramic floor 1116. Metallizations 1116, 1120, and 1122 are electrically isolated from each other.

Four strip conductor leads 1138, 1140, 1142 and 1148 are mechanically connected to the bottom of carrier body 1110a. In effect, the strip conductor leads are fastened to the bottom of "floor" 1116. Thus, the strip conductor leads are coplanar, but lie in a plane below the plane of metallizations 1118, 1120 and 1122. Body 1110a is provided with additional metallizations (not illustrated), which connect metallizations 1120 and 1122 to strip conductors 1140 and 1142, respectively. Further metallizations (not illustrated) connect the two wide ends of metallization 1118 to the ends (not visible in FIG. 11) of strip conductors 1138 and 1148. Yet further metallizations are provided by which lid 1110b may be brazed to the upper portion of carrier body 1110a to form a hermetically sealed unit.

Figure 11B:
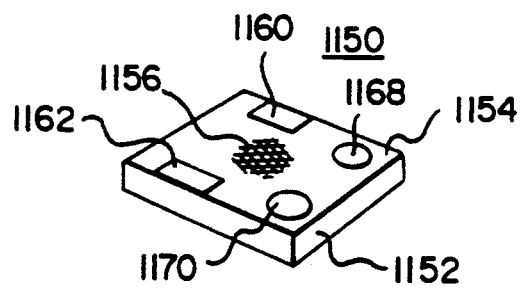
Figure 11A:
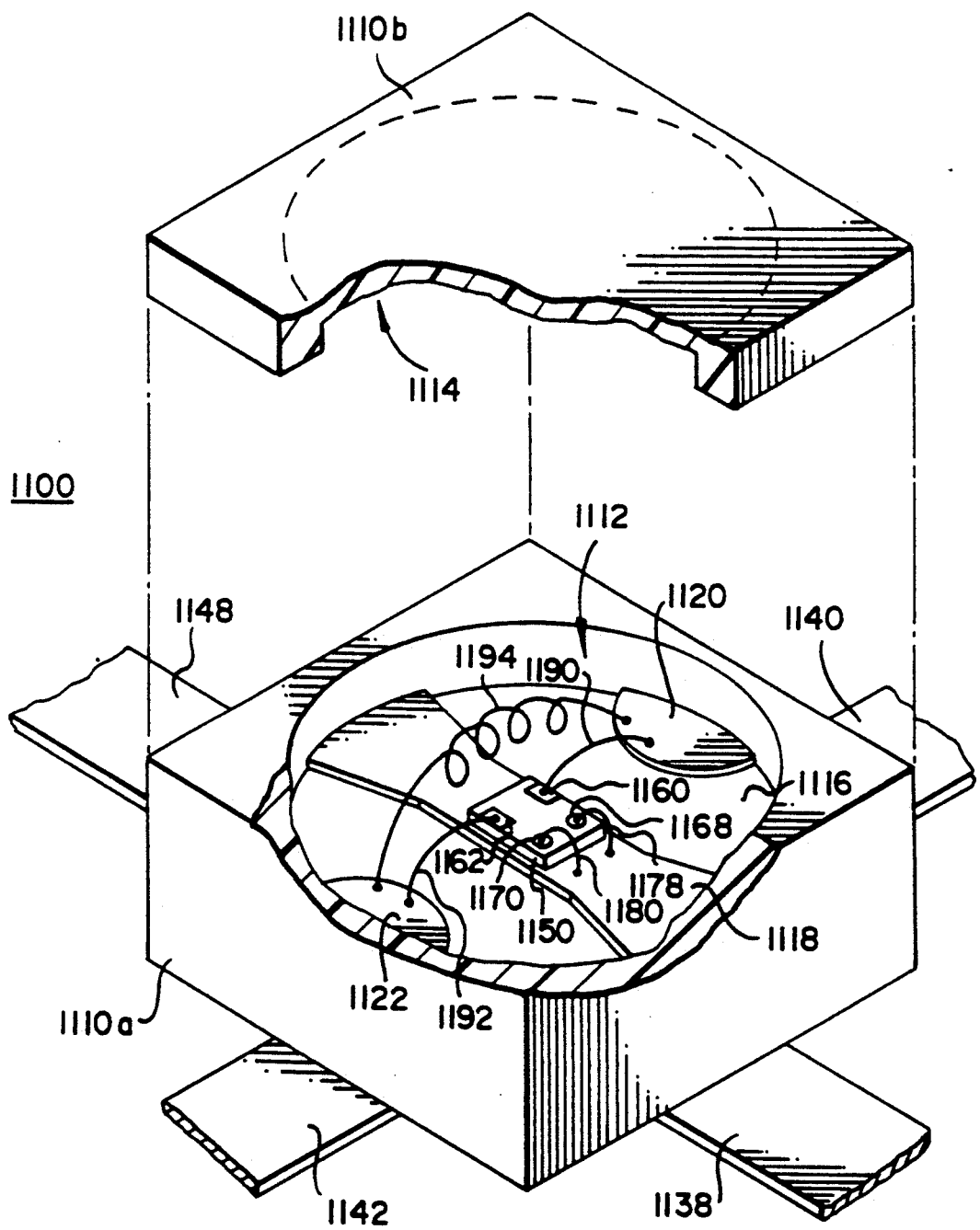

FIG. 11b is a perspective or isometric view of a chip FET 1150 including a semiconductor substrate 1152, an upper surface 1154 which has a FET formed therein in a conventional manner. As illustrated, the active portion of the FET is represented by a crosshatched region 1156. A source metallization 1160 and a drain metallization 1162, and two gate metallizations 1168 and 1170 are associated with FET active region 1156. The two gate metallizations are plural contacts to a single active gate.

As illustrated in FIG. 11a, chip FET 1150 of FIG. 11b is mounted on platform metallization 1118. Chip substrate 1152 has relatively low conductivity, so the active portion 1156 is isolated from direct contact with platform 1118. A bond wire 1180 about 0.7 mil (0.0007 inch) in diameter and with a length of about 10 mils extends in a half-loop from gate metallization 1170 to platform metallization 1118, and a similar wire 1178 extends from gate metallization 1168 to platform metallization 1118, thereby providing a somewhat inductive galvanically conductive path between strip conductors 1138, 1148 and the gate of FET 1150. Also illustrated in FIG. 11a is a multiturn solenoidal inductor coil 1194 formed from a 0.7 mil wire 120 mils long, extending from metallization 1120 to metallization 1122. As mentioned, the inductance depends not only upon the mutually coupled loops or turns of wire 1194, but also upon the area enclosed by the complete circuit. Thus, simply raising or lowering the solenoidal coil relative to the "floor" of the carrier will result in an increase or decrease, respectively, of inductance.

FIG. 11c illustrates how an integrated circuit linearizer or equalizer such as 1100 of FIG. 11a may be mounted on a microstrip-style printed wiring board. In FIG. 11c, carrier body 1110b with lid 1110a in place is mounted on the upper surface of a printed wiring board designated generally as 1102, which includes a dielectric substrate plate 1104, a lower reference or ground conductor 1106, and strip transmission line conductors 1108 and 1109. A further reference or ground conductor (not illustrated) is attached to the upper surface of substrate 1104 adjacent to strip transmission conductors 1108 and 1109, and is at the same potential as the lower ground conductor. Strip conductors 1140 and 1142 are connected to substrate strip transmission line conductors 1108 and 1109, respectively, to interpose integrated linearizer 1100 in the transmission path of 1108 and 1109. As illustrated in FIG. 11c, a bias tee in the form of an RFC 1111 is connected to strip transmission conductor 1109 at a location away from strip conductor 1142. RFC 1111 has a first terminal 1113 adapted for receiving bias voltage in a bias circuit configuration in which the source is coupled between ground and the drain, and an RFC is connected to a strip conductor, as in FIG. 4.

In the abovementioned mounting, strip conductors 1148 and 1138 of FIG. 11a overlie upper-surface ground (not illustrated in FIG. 11c) and are soldered or brazed thereto to form a low-impedance, galvanic connection to reference. Thus, gate terminals 1168 and 1170 of FET 1152 are directly connected to reference ground, with the inductance of bond wire 1178, 1180 loops to provide the desired gate impedance.

Figure 12A:
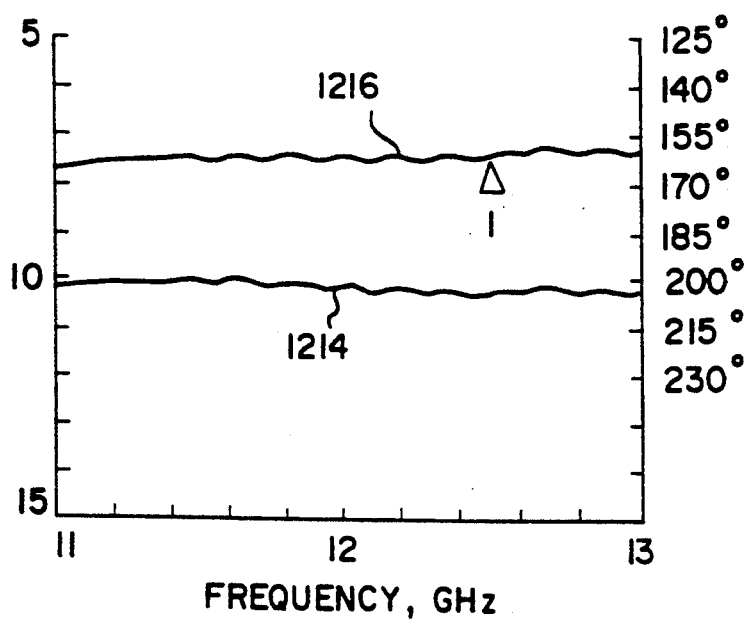
FIGS. 12a and 12b are phase-and-amplitude-versus-frequency plots of the performance of a distortion generator as described in conjunction with FIG. 11c.
Figure 12B:
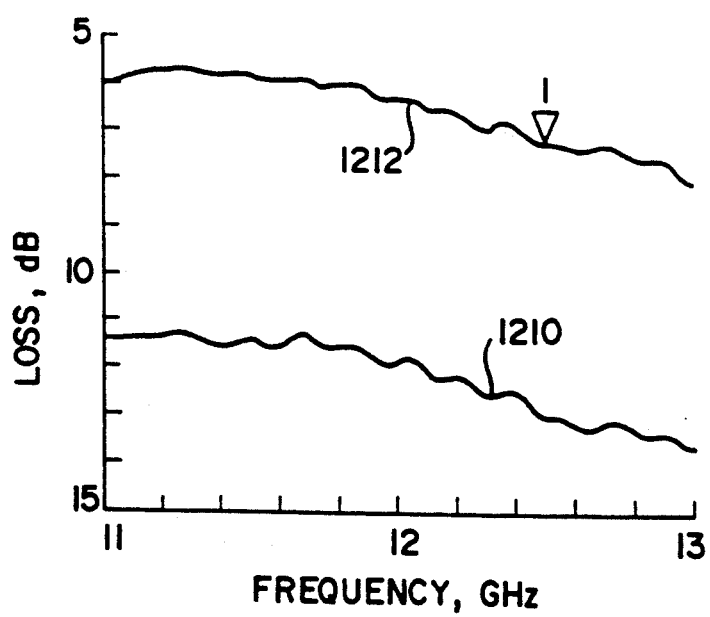

FIG. 12a plots phase versus frequency over the range 11 to 13 GHz for an integrated distortion generator at two different power levels. In FIG. 12a, plot 1214 represents transmission phase response at a power input level of −25 dBm, and plot 1216 represents the phase response at 0 dBm input power. In FIG. 12b, plot 1210 represents the gain (the plot shows negative gain or loss) at −25 dBm, while plot 1212 represents 0 dBm. As illustrated, operation of the integrated distortion generator appears to be more consistent than that of a non-integrated unit. In addition to the improve performance, the very small size and light weight of the integrated linearizer, the change (in response and amplitude) of phase and amplitude are more consistent over the frequency band. It was found that comparable performance could not be attained if the shunt impedance or inductor (310 of FIG. 3, 410 of FIG. 4) was connected, external to the carrier 1100 of FIG. 11a, between strip conductors 1140 and 1142.

Other embodiments of the invention will be apparent to those skilled in the art. For example, any form of transmission line, such as coax, may be used to couple signal to and from the distortion generator. A plurality of FETs may have their controllable current paths paralleled for operation at high power levels by joining their like electrodes for simultaneous operation. Also, the source and drain connections of the FET may be reversed, if desired. Other miniature packages may be used, and may allow or require that bias be coupled to the gate electrode of the FET through an additional terminal of the package.

What is claimed is:

1. An integrated distortion equalizer comprising:
   a semiconductor-integrated-circuit carrier, including a substantially planar electrically and thermally conductive platform, said carrier also including first and second electrically conductive terminals mounted adjacent to and electrically isolated from said platform;
   a semiconductor substrate including a first surface and also including a second surface mechanically affixed to said platform, said first surface being electrically isolated from said platform;
   a field effect transistor formed on said first surface of said semiconductor substrate, said field effect transistor including source, drain and gate electrodes, and also including a controllable path for the flow of signal between said source and drain electrodes under the control of a direct gate bias voltage applied between said gate and at least one of said source and drain electrodes; and
   transistor electrode coupling means coupled to said carrier and to said transistor, and including (a) a first portion for coupling said source electrode to one of said first and second terminals of said carrier, (b) a second portion for coupling said drain electrode to the other one of said first and second terminals, and (c) a third portion for galvanically connecting said gate electrode to said platform by means of a selected first impedance;

2. An equalizer according to claim 1 further comprising:
   second impedance means coupled between said source and drain electrodes of said field effect transistor.

3. An equalizer according to claim 2, wherein said third portion of said transistor electrode coupling means comprises inductance means in the form of a bond wire formed in a loop encompassing an area selected for a desired value of inductance.

4. An equalizer according to claim 1, wherein said integrated-circuit carrier is a KYOCERA type 70 package.

5. An equalizer according to claim 2, wherein said second impedance means comprises inductance means.

6. An equalizer according to claim 5 for operation in K band, wherein said inductance means comprises a multiturn solenoidal coil having a diameter of about 0.01 inch and a length of about 0.02 inch.

7. An equalizer according to claim 6, wherein said multiturn coil has about 3½ turns.

8. An equalizer according to claim 6, wherein said field effect transistor is a GaAs transistor.

9. An equalizer according to claim 1, further comprising: a first strip transmission line extending from said first terminal of said carrier to a source of signal to be distorted, and a second strip transmission line, coplanar with said first strip transmission line, extending from said second terminal of said carrier to a utilization means, said first and second strip transmission lines being associated with a common reference conductor;

carrier gate platform coupling means coupled to said platform and to said reference conductor for providing a galvanic conduction path between said common reference conductor and said platform, whereby a galvanic connection is formed between said reference conductor and said gate electrode;

a bias tee including a first end, and also including a second end coupled to one of said first and second terminals of said carrier; and direct bias voltage generating means coupled to said reference conductor and to said first end of said bias tee;

10. An equalizer according to claim 9, wherein at least one of said first and second portions of said transistor electrode coupling means additionally provides a galvanic connection.

11. An equalizer according to claim 10, wherein said second end of said bias tee is coupled to said one of said first and second terminals of said carrier by means of a connection of said second end of said bias tee to a corresponding one of said first and second strip transmission lines.

12. An equalizer according to claim 1, where at least one of said first and second portions of said transistor electrode coupling means additionally provides a galvanic connection.

* * * * *